(12) United States Patent
Martin et al.

(10) Patent No.: US 7,883,744 B2
(45) Date of Patent: Feb. 8, 2011

(54) USE OF A TITANIUM-COPPER-NICKEL-BASED ALLOY

(75) Inventors: Michel Martin, Septeme (FR); Frederic Faverjon, Chamboeuf (FR)

(73) Assignee: H.E.F., Andrezieux Boutheon (FR)

( * ) Notice: Subject to any disclaimer, the term of this patent is extended or adjusted under 35 U.S.C. 154(b) by 839 days.

(21) Appl. No.: 11/718,426

(22) PCT Filed: Oct. 21, 2005

(86) PCT No.: PCT/FR2005/050882
§ 371 (c)(1), (2), (4) Date: Jul. 24, 2007

(87) PCT Pub. No.: WO2006/048568
PCT Pub. Date: May 11, 2006

(65) Prior Publication Data
US 2007/0297933 A1      Dec. 27, 2007

(30) Foreign Application Priority Data
Nov. 5, 2004   (FR)   .................... 04 52535

(51) Int. Cl.
C23C 16/00   (2006.01)
(52) U.S. Cl. .................... 427/248.1; 427/404; 427/457; 428/40.1; 428/42.2; 359/507; 359/883
(58) Field of Classification Search ............... 427/248.1, 427/404; 428/40.1, 42.2; 359/507, 883
See application file for complete search history.

(56) References Cited

U.S. PATENT DOCUMENTS

| | | | | |
|---|---|---|---|---|
| 4,126,449 A | * | 11/1978 | Tanner et al. | ............... 148/403 |
| 4,477,488 A | | 10/1984 | Sugita et al. | |
| 5,044,947 A | * | 9/1991 | Sachdeva et al. | ............... 433/20 |
| 5,133,757 A | | 7/1992 | Sioshansi et al. | |
| 5,288,344 A | * | 2/1994 | Peker et al. | .................. 148/403 |
| 5,990,449 A | * | 11/1999 | Sugiyama et al. | ........... 219/219 |
| 6,270,849 B1 | * | 8/2001 | Popoola et al. | ............. 427/404 |
| 6,358,588 B1 | * | 3/2002 | Edwards et al. | ............. 428/42.2 |
| 6,562,471 B1 | | 5/2003 | Martin et al. | |
| 7,663,798 B2 | * | 2/2010 | Tonar et al. | .................. 359/265 |
| 2002/0027727 A1 | | 3/2002 | Lang et al. | |
| 2002/0189719 A1 | | 12/2002 | Rasmussen et al. | |
| 2003/0223136 A1 | | 12/2003 | Bade et al. | |

FOREIGN PATENT DOCUMENTS

| | | |
|---|---|---|
| EP | 0682368 | 11/1995 |
| FR | 2768096 | 2/1991 |
| JP | 58068229 | 4/1983 |
| JP | 01037482 | 2/1989 |

* cited by examiner

*Primary Examiner*—Shamim Ahmed
(74) *Attorney, Agent, or Firm*—Heslin Rothenberg Farley & Mesiti P.C.

(57) ABSTRACT

A titanium-copper-nickel based alloy is used for the formation of at least one resistive thin film on a polymer substrate. The alloy comprises 50 to 80% by weight of titanium, 10 to 25% by weight of copper and 10 to 25% by weight of nickel. The thin film has a thickness between about 100 and 160 nanometres.

4 Claims, No Drawings

USE OF A TITANIUM-COPPER-NICKEL-BASED ALLOY

CROSS-REFERENCE TO RELATED APPLICATIONS

This application is a Section 371 filing of International Application PCT/FR2005/050882 filed on Oct. 21, 2005 and published, in French, as International Publication No. WO 2006/048568 A2 on May 11, 2006, which claims priority from French application no. 0452535 filed on Nov. 5, 2004, which applications are hereby incorporated by reference herein, in their entirety.

FIELD OF THE INVENTION

The invention relates to a polymer substrate whereof at least one of the sides is arranged to constitute a heating zone.

BACKGROUND

Various technical solutions have been proposed for preparing heating resistors on a substrate. For example, heating elements in the form of a resistance comprising a copper wire, for example, can be bonded to the substrate. However, this solution is unsatisfactory because it requires a long and costly manufacturing process, generating integration constraints, and liable to at least partial detachment of the heating element during heating cycles, associated with the variations in moisture of the environment.

Another solution for replacing the bonding is the electrolytic deposition of resistive materials. However, besides the fact that the level of adhesion obtained is unsatisfactory, it appears that the electrolysis is limited to the deposition of a small number of materials, of which the resistivity is too low to constitute a heating element without preparing a resistive circuit by complex methods of selective deposition, etching or marking.

In view of the above, to solve the problem posed of obtaining high and durable adhesion, at the same time as a wide choice of materials having satisfactory resistivity, it has appeared that vacuum deposition techniques, particularly by cathode sputtering, may provide a satisfactory solution.

Thus U.S. Pat. No. 6,365,483 describes a method for creating a heating system by the vacuum deposition of a resistive material known to a person skilled in the art. The technical solution described in this document is unsatisfactory because it imposes a long and costly process, involving at least one step for preparing a resistive circuit by photolithography technologies in order to obtain the desired resistance of the film.

Another technical problem to be solved appears with regard to the material used, depending on the intended application, when the heating system has to operate in a corrosive environment. This may be the case, for example, for defrosting rear view mirrors of motor vehicles, where the substrate, receiving the reflecting part, can be heated. The resistive film, that is the heating film, must withstand this type of environment. Moreover, the resistive film must advantageously be able to be supplied with 12 V or 48 V voltage, for example, but must not be too thin to be easily controlled by the conventional method, nor too thick, in order to avoid increasing its cost and decreasing its service life for reasons perfectly known to a person skilled in the art (cracking, residual stresses, etc.). This dual constraint, resulting from a predefined thickness on the one hand, and from the need for a power supply voltage on the other, defines an imperative acceptable resistivity range for the choice of the material.

It has appeared that the materials currently available and known for their resistivity properties are unsuitable for achieving these objectives.

Surprisingly and unexpectedly, it has appeared that titanium-copper-nickel based alloys constitute a satisfactory solution for solving the problem posed, since such alloys have a resistivity of between 200 and 300 μohm/cm and also excellent corrosion resistance (above 400 hours in salt mist), according to standard NFX41002.

While such titanium-copper-nickel alloys are perfectly familiar to a person skilled in the art, as a brazing alloy (U.S. Pat. No. 3,651,099, U.S. Pat. No. 3,652,237) usable for its biocompatible properties (U.S. Pat. No. 4,774,953) or as an adhesion promoter in metal matrix composites (U.S. Pat. No. 410,133, U.S. Pat. No. 5,645,747, U.S. Pat. No. 5,530,228), they are not known to have resistivity properties, no publication having reported such properties.

It has also been observed that, contrary to most materials deposited in thin films, this range of titanium-copper-nickel alloys has the particular feature of preserving a constant resistivity, even after several heating-cooling cycles.

BRIEF SUMMARY OF THE INVENTION

Considering this discovery, the invention relates to a use of a titanium-copper-nickel based alloy for the formation of at least one resistive thin film on a substrate.

To solve the problem posed of preparing resistive thin films having a predefined thickness, the alloy is applied to the substrate by cathode sputtering. The thickness of the thin film is between about 100 and 160 nanometres.

Advantageously, the alloy comprises a mass fraction of 69% by weight of titanium, 15.5% by weight of copper and 15.5% by weight of nickel. More generally, the alloy comprises 50 to 80% by weight of titanium, 10 to 25% by weight of copper and 10 to 25% by weight of nickel.

According to one exemplary embodiment, the substrate constitutes a plane surface whereof the side opposite to the side coated with the resistive film containing the titanium-copper-nickel alloy, is coated with a reflecting film, the said resistive film is subjected to a power source to subject it to a voltage of about 12V or 48 V.

The substrate may advantageously constitute a support for the "mirror" portion of a motor vehicle rear view mirror, particularly by using the said resistive film for defrosting the said mirror.

DETAILED DESCRIPTION

The invention will be better understood from the examples provided below for information but non-limiting.

Examples According to the Invention

It is necessary to dissipate a power of 12 W on a rectangular polycarbonate substrate using a power supply voltage of 12 V, which leads to defining a resistive film having a total resistance of 12 ohms. By applying to this surface, by plasma vapour deposition (PVD) a titanium-copper-nickel alloy film having the composition Ti69 Cu15.5, Ni15.5 (mass fraction), whereof the resistivity is measured at 250 μohm/cm, the resistance of 12 ohms is obtained for a film thickness of 130 nanometres. The resistive film thereby obtained serves to dissipate, under a voltage of 12 V, a power of 12 W during a period of 1000 h, without any detachment or deterioration of the film. On completion of this test, the resistivity varied by only 3% from its initial value. Moreover, subjected to a salt mist according to standard NFX41002, the resistivity was unchanged (other examples similarly be provided according to the invention).

Examples not Conforming to the Invention

Titanium-copper-nickel alloy, having a mass composition Ti2Cu66Ni32. Its resistivity is 42 µohm/cm, which would, under the same conditions as in example 1, lead to a resistance of 12 ohms for a film thickness of 22 nanometres, which is completely unrealistic on non-plane parts.

Tests were performed with pure titanium films whereof the resistivity was measured at 140 µohm/cm, the thickness necessary for the film is accordingly 90 to 100 nanometres. Similarly, nickel/vanadium alloy, containing 4% vanadium, is known for this use, its resistivity of 80 µohm·cm leads to films whereof the thickness is between 20 and 50 nanometres. These thicknesses are close to the thickness limit obtainable with sufficient reliability by known industrial methods. Moreover, it has been observed on a polymer substrate, that for thicknesses lower than 100 nanometres, it is impossible to dissipate a power of 12 W without causing the premature destruction of the resistive film.

The present invention is not limited to the embodiment explicitly described, but includes miscellaneous alternatives and generalizations thereof, contained within the scope of the claims below.

These advantages clearly appear from the description.

The invention claimed is:

1. A method for forming a resistive thin film on a polymer substrate, comprising applying to said polymer substrate a titanium-copper-nickel based alloy comprising 50 to 80% by weight of titanium, 10 to 25% by weight of copper and 10 to 25% by weight of nickel, wherein the thickness of the thin film is between about 100 and 160 nanometres and whereby said resistive thin film exhibits electrical resistivity at a voltage between 12 volts and 48 volts.

2. A method according to claim 1, wherein the alloy is applied to the substrate by vapour deposition.

3. A method according to claim 1, wherein the alloy comprises 69% by weight of titanium, 15.5% by weight of copper and 15.5% by weight of nickel.

4. A method according to claim 1, wherein the substrate constitutes a surface whereof a side opposite to a side coated with the resistive film containing the titanium-copper-nickel alloy, is coated with a reflecting film, and the resistive film is subjected to a power source to subject the resistive film to a voltage of about 12V.

* * * * *